(12) United States Patent
Jain et al.

(10) Patent No.: US 10,535,793 B2
(45) Date of Patent: Jan. 14, 2020

(54) GROUP III NITRIDE HETEROSTRUCTURE FOR OPTOELECTRONIC DEVICE

(71) Applicant: Sensor Electronic Technology, Inc., Columbia, SC (US)

(72) Inventors: Rakesh Jain, Columbia, SC (US); Maxim S. Shatalov, Columbia, SC (US); Jinwei Yang, Columbia, SC (US); Alexander Dobrinsky, Loudonville, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 22 days.

(21) Appl. No.: 15/602,677

(22) Filed: May 23, 2017

(65) Prior Publication Data
US 2017/0256672 A1 Sep. 7, 2017

Related U.S. Application Data

(63) Continuation of application No. 14/493,388, filed on Sep. 23, 2014, now Pat. No. 9,660,133.

(60) Provisional application No. 61/881,192, filed on Sep. 23, 2013.

(51) Int. Cl.
| | | |
|---|---|---|
| H01L 33/00 | (2010.01) | |
| H01L 33/04 | (2010.01) | |
| H01L 33/32 | (2010.01) | |
| H01L 33/06 | (2010.01) | |
| H01L 33/12 | (2010.01) | |
| H01L 33/14 | (2010.01) | |

(52) U.S. Cl.
CPC ........ *H01L 33/0025* (2013.01); *H01L 33/007* (2013.01); *H01L 33/0075* (2013.01); *H01L 33/04* (2013.01); *H01L 33/06* (2013.01); *H01L 33/12* (2013.01); *H01L 33/32* (2013.01); *H01L 33/145* (2013.01)

(58) Field of Classification Search
None
See application file for complete search history.

(56) References Cited

U.S. PATENT DOCUMENTS

| | | | |
|---|---|---|---|
| 7,462,884 B2 | 12/2008 | Sanga et al. | |
| 7,692,182 B2 | 4/2010 | Bergmann et al. | |
| 8,330,168 B2 | 12/2012 | Ohta et al. | |

(Continued)

FOREIGN PATENT DOCUMENTS

| | | |
|---|---|---|
| CN | 101006590 A | 7/2007 |
| CN | 103208572 A | 7/2013 |

(Continued)

OTHER PUBLICATIONS

Fazhen, S., Application No. 201480052198.6, Office Action1 (with English translation), dated Dec. 1, 2017, 10 pages.

(Continued)

*Primary Examiner* — Long Pham
(74) *Attorney, Agent, or Firm* — LaBatt, LLC

(57) ABSTRACT

Heterostructures for use in optoelectronic devices are described. One or more parameters of the heterostructure can be configured to improve the reliability of the corresponding optoelectronic device. The materials used to create the active structure of the device can be considered in configuring various parameters the n-type and/or p-type sides of the heterostructure.

18 Claims, 10 Drawing Sheets

(56) References Cited

U.S. PATENT DOCUMENTS

| | | |
|---|---|---|
| 8,957,432 B2 | 2/2015 | Kim et al. |
| 2003/0087462 A1 | 5/2003 | Koide et al. |
| 2011/0001127 A1 | 1/2011 | Sakamoto et al. |
| 2012/0201264 A1 | 8/2012 | Shatalov et al. |
| 2012/0217473 A1 | 8/2012 | Shur et al. |
| 2013/0157442 A1 | 6/2013 | Bondokov et al. |
| 2013/0181188 A1 | 7/2013 | Ooshika |
| 2013/0082237 A1 | 12/2013 | Northrup et al. |
| 2014/0110754 A1 | 4/2014 | Jain et al. |
| 2015/0083994 A1 | 3/2015 | Jain et al. |

FOREIGN PATENT DOCUMENTS

| | | |
|---|---|---|
| JP | 2002280610 A | 9/2002 |
| JP | 2007067077 A | 3/2007 |
| JP | 2009158804 A | 7/2009 |
| JP | 5125513 B2 | 1/2013 |
| KR | 10-2011-0081033 A | 7/2011 |
| KR | 10-2011-0120019 A | 11/2011 |
| KR | 10-2013-0083859 A | 7/2013 |

OTHER PUBLICATIONS

Chinese Application No. 201480052198.6, Notice of Allowance (An English translation is not available), dated Jun. 13, 2018, 2 pages.

Yoon, N., Korean Application No. 10-2016-7010861, Office Action2 (with English translation), dated Oct. 30, 2017, 10 pages.

Prenty, M., U.S. Appl. No. 14/493,388, Notice of Allowance, dated Jan. 17, 2017, 7 pages.

Prenty, M., U.S. Appl. No. 14/493,388, Office Action 2, dated Aug. 24, 2016, 6 pages.

Prenty, M., U.S. Appl. No. 14/493,388, Office Action 1, dated Feb. 9, 2016, 8 pages.

Kim, T., International Application No. 2014056863, International Search Report and Written Opinion, dated Jan. 2, 2015, 9 pages.

Yoon, N., Korean Application No. 10-2016-7010861, Office Action1 (with English translation), dated Jan. 24, 2017, 19 pages.

Bykhovski et al., Elastic strain relaxation and piezoeffect in GaN—AlN, GaN—AlGaN and GaN—InGaN superlattices, J. Appl. Phys. 81 (9), (1997), 8 pages.

Gaska et al., Electron mobility in modulation-doped AlGaN—GaN heterostructures, Appl. Phys. Lett. 74, 287 (1999), 4 pages.

Gaska et al., Piezoelectric Doping and Elastic Strain Relaxation in AlGaN/GaN HFETs, Appl. Phys. Lett. vol. 73, No. 24, 3577 (1998), 4 pages.

Ohba, Y. and R. Sato, Growth of AlN on sapphire substrates by using a thin AlN buffer layer grown two dimensionally at a very low V/III ratio, ournal of Crystal Growth, vol. 221, Issues 1-4, Dec. 2000, 4 pages.

Reina et al., Control of AlN buffer/sapphire substrate interface for AlN growth, Miyagawa, Phys. Status Solidi C, vol. 8, No. 7-8, 2069-2071 (2011), 3 pages.

Rumyantsev et al., Generation-Recombination Noise in GaN-based Devices, from GaN-based Materials and Devices: Growth, Fabrication, Characterization and Performance, Syst. 14, 175 (2004), 23 pages.

— $Al_{0.25}Ga_{0.75}N$ layer with abrupt heterointerface with GaN

● Graded heterointerface: $Al_{0.25}Ga_{0.75}N$ -> GaN

FIG. 7

| | |
|---|---|
| Active Structure | 22 |
| n-type Layer | 20 |
| Fourth TCSL | 42D |
| Grading Structure | 32 |
| Third TCSL | 42C |
| Second Superlattice Structure | 18 |
| Second TCSL | 42B |
| First Superlattice Structure | 16 |
| First TCSL | 42A |
| Buffer Layer | 14 |
| Substrate | 12 |

40

GROUP III NITRIDE HETEROSTRUCTURE FOR OPTOELECTRONIC DEVICE

REFERENCE TO RELATED APPLICATIONS

The current application is a continuation of U.S. patent application Ser. No. 14/493,388, filed 23 Sep. 2014, which claims the benefit of U.S. Provisional Application No. 61/881,192, filed on 23 Sep. 2013, each of which is hereby incorporated by reference.

TECHNICAL FIELD

The disclosure relates generally to optoelectronic devices, and more particularly, to group III nitride heterostructures for use in fabricating optoelectronic devices.

BACKGROUND ART

Development of electronic and optoelectronic devices, such as group III nitride based light emitting diodes (LEDs), with high efficiency and reliability depends on many factors. Such factors include: the quality of the semiconductor layers, active layer design, and contact quality. Designing high quality semiconductor layers is especially important for a number of electronic and optoelectronic devices including ultraviolet light emitting diodes (UV LEDs). The quality of a semiconductor layer is determined by a number of dislocations in the semiconductor layer as well as the stresses present in the material. When the stresses become larger than threshold stresses, the reliability of a structure can be compromised due to the formation of carrier capturing defects during the operation of the device. The conducting characteristics of the device also can be altered during device operation due to formation of cracks and defects. Furthermore, a resultant junction temperature increase can further affect the reliability and efficiency of the device.

To reduce overall stresses in the device and further reduce dislocation density, careful selection of epitaxial layers is required. Additionally, carefully selected barriers and quantum wells are needed to produce the target emission wavelength without imposing too much stresses and strains on the active layer. Furthermore, controlling stresses in the p-type layers are essential in order to ensure the reliability of the device.

Previous approaches have sought to control stresses without sacrificing electrical properties of the device. In one approach, the semiconductor structure is grown on a native aluminum nitride (AlN) substrate. A benefit of growing on an AlN crystal substrate is a small lattice mismatch between the substrate and the remaining semiconductor layers. Nevertheless, fabricating on an AlN substrate is difficult and expensive. Furthermore, only relatively small size AlN substrates can be fabricated, resulting in a small device yield.

Currently, a standard approach includes epitaxially growing a group III nitride semiconductor on a substrate made of sapphire, silicon carbide (SiC), or the like. However, the lattice constant and the coefficient of thermal expansion are significantly different between the substrate and the epitaxially grown semiconductor layers. As a result, cracks, dislocations, and pits can develop in the semiconductor layers during the epitaxial growth. A quality of a semiconductor layer can be further affected by point defects, compositional inhomogeneities, and inhomogeneities in doping concentration.

To solve this problem, various techniques have been developed to mitigate the effect of the substrate by growing a buffer layer that can absorb substrate induced stresses, and generally provide a layer which is closely lattice matched with subsequent epitaxial layers. For example, one approach seeks to produce a highly crystalline group III nitride semiconductor layer, where crack formation is prevented, on a silicon substrate by providing an AlN-based superlattice buffer layer having multiple first layers made of $Al_xGa_{1-x}N$, where the Al content x: $0.5<x<1$, and multiple second layers made of $Al_yGa_{1-y}N$, where the Al content y: $0.01<y<0.2$, which are alternately stacked, between the silicon substrate and the group III nitride semiconductor layer.

In another approach for obtaining a highly crystalline group III nitride semiconductor layer, the group III nitride semiconductor layer is formed on a superlattice composite layer by forming an AlN buffer layer on a silicon substrate and sequentially stacking, on the AlN buffer, a composition graded layer having a composition graded such that the aluminum content decreases in the crystal growth direction, and a superlattice composite layer, in which high Al-content layers and low Al-content layers are alternately stacked.

In still another approach, the AlN buffer layer was grown using metalorganic chemical vapor deposition (MOCVD) on a sapphire substrate. Growth conditions were optimized using a two-step growth technique, in which the first-step growth was done at a low temperature (1200° C.) and followed by the second-step growth at a high temperature (1270° C.). At the first-step growth, the substrate was entirely covered by two-dimensionally grown AlN by decreasing a V/III ratio to 1.5, although microcrystalline islands were observed at V/III ratios of 1.2 and 4.0. The approach reportedly yielded an almost pit-free flat surface after the second-step growth.

Approaches have sought to control growth of the AlN buffer through optimization of MOCVD process. For example, in one approach, the growth condition of AlN buffer layer was studied to fabricate a high-quality AlN layer on a sapphire substrate. Trimethylaluminum (TMA) and ammonia ($NH_3$) were used as precursors for Al and N, respectively. Prior to the growth, the substrate was cleaned in an $H_2$ atmosphere at 1000-1100° C. for ten minutes. The AlN buffer layer was then grown at a V/III ratio of 2763 with the growth temperature varied from 800 to 1250° C., with a thickness of 5-50 nm. Finally, a 1 μm AlN layer was grown at 1430° C. with a V/III ratio of 584 under a pressure of 30 Torr.

An effect of the substrate on electron mobility can be demonstrated by measuring electron mobility in modulation-doped $Al_{0.2}Ga_{0.8}N$—GaN heterostructures grown on various substrates. For example, FIGS. 1A and 1B show electron mobility measurements for sapphire, conducting 6H—SiC, and insulating 4H—SiC substrates as a function of the sheet electron density, ns, at the heterointerface. As illustrated by these measurements, a slightly higher electron mobility is obtained on a SiC substrate than that on sapphire substrate. The higher electron mobility is likely attributed to higher quality layers grown on the SiC substrate as compared to sapphire, perhaps due to a lower lattice constant mismatch between AlGaN and SiC.

AlGaN/AlGaN heterostructures as well as AlGaN/GaN heterostructures have various traps associated with the dislocations created in the layers. For example, FIG. 2 shows various traps associated with such heterostructures according to the prior art.

Levels of stresses/strains in a heterostructure, such as an AlGaN/GaN heterostructure, depend on the layer thicknesses. For example, FIG. 3 shows relative strain in an $Al_{0.25}Ga_{0.75}N$ layer grown on a thick GaN substrate according to the prior art. When the layer thickness is increased, the resulting stress is decreased due to formation of dislocations and other defects (e.g., stress relaxation). For example, prior to the abrupt interface, the strain is high. However, moving further away from the abrupt interface, the strain relaxes due to the presence of dislocations. To a good approximation, the stress depends linearly and proportionally to the strain within a layer. Consequently, as illustrated in FIG. 3, for an abrupt interface, the stress decreases rapidly, while the stress decreases more slowly for a graded interface.

A critical thickness of a layer can be defined as the thickness at which the dislocations become energetically favorable. For AlGaN layers, the critical thickness depends on the Al molar ratio. For example, FIG. 4 shows the dependence of the critical thickness on the aluminum molar ratio of an AlGaN layer in an AlGaN/GaN heterostructure according to the prior art. As illustrated, as the Al molar ratio increases, the stresses present due to lattice mismatch also increase, which results in a decreasing critical thickness of the AlGaN layer.

SUMMARY OF THE INVENTION

Aspects of the invention provide heterostructures for use in optoelectronic devices and the resulting optoelectronic devices. One or more parameters of the heterostructure can be configured to improve the reliability of the corresponding optoelectronic device. The materials used to create the active structure of the device can be considered in configuring various parameters the n-type and/or p-type sides of the heterostructure.

A first aspect of the invention provides a heterostructure comprising: a substrate; an AlN buffer layer located on the substrate; a $Al_xGa_{1-x}N/Al_xGa_{1-x}N$ first superlattice structure located on the buffer layer, wherein $0.6 < x \le 1$, $0.1 < x' < 0.9$, and $x > x'$, and wherein each layer in the first superlattice structure has a thickness less than or equal to one hundred nanometers; a $Al_yGa_{1-y}N/Al_yGa_{1-y}N$ second superlattice structure located on the first superlattice structure, wherein $y' < x'$, $0.6 < y \le 1$, $0.1 < y' < 0.8$, and $y > y'$, and wherein each layer in the second superlattice structure has a thickness less than one hundred nanometers; an $Al_zGa_{1-z}N$ n-type layer located on the second superlattice structure, wherein $0.1 < z < 0.75$ and $z < y'$; and an $Al_bGa_{1-b}N/Al_qGa_{1-q}N$ active structure, wherein $b - q > 0.05$.

A second aspect of the invention provides a heterostructure comprising: a substrate; a buffer layer located on the substrate, wherein the buffer layer is formed of a group III nitride material including aluminum; a grading structure located on the buffer layer, wherein the grading structure is formed of a group III nitride material having an aluminum molar fraction that decreases from an aluminum molar fraction at a bottom heterointerface to an aluminum molar fraction at a top heterointerface; a n-type layer located on the grading structure, wherein the n-type layer is formed of a group III nitride material including aluminum having a molar fraction z, and wherein $0.1 < z \le 0.9$; an active structure including quantum wells and barriers, wherein the quantum wells are formed of a group III nitride material including aluminum having a molar fraction q and the barriers are formed of a group III nitride material including aluminum having a molar fraction b, and wherein $b - q > 0.05$; an electron blocking layer located on the active structure, wherein the electron blocking layer is formed of a group III nitride material including aluminum having a molar fraction B, and wherein B is at least $1.05*b$; a p-type GaN layer located on the electron blocking layer; and a graded p-type layer located between the electron blocking layer and the GaN layer, wherein the graded p-type layer has an aluminum molar fraction that decreases from B at a heterointerface between the electron blocking layer and the graded p-type layer to zero at a heterointerface between the graded p-type layer and the GaN layer.

A third aspect of the invention provides a method of fabricating a device, the method comprising: creating a device design for the device, wherein the creating includes configuring a n-type side of a heterostructure for the device based on an active structure in the heterostructure including quantum wells and barriers based on a target wavelength for the device, wherein the quantum wells are formed of a group III nitride material including aluminum having a molar fraction q and the barriers are formed of a group III nitride material including aluminum having a molar fraction b, and wherein $b - q > 0.05$, wherein the configuring includes: configuring a grading structure located between the active structure and a buffer layer of the heterostructure, wherein the grading structure is formed of a group III nitride material having an aluminum molar fraction that decreases from an aluminum molar fraction at a bottom heterointerface to an aluminum molar fraction at a top heterointerface; and configuring a n-type layer located between the grading structure and the active structure, wherein the n-type layer is formed of a group III nitride material including aluminum having a molar fraction z selected based on at least one of: b or q; and fabricating the device according to the device design.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 7 shows another illustrative heterostructure according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide heterostructures for use in optoelectronic devices and the resulting optoelectronic devices. One or more parameters of the heterostructure can be configured to improve the reliability of the corresponding optoelectronic device. The materials used to create the active structure of the device can be considered in configuring various parameters the n-type and/or p-type sides of the heterostructure.

An illustrative embodiment can improve the reliability of a device through simultaneous optimization of several parameters of the heterostructure. These parameters can include: compositional profiles of the semiconductor layers; doping profiles of the semiconductor layers; and thicknesses of the semiconductor layers. Additionally, optimization of strains within the semiconductor layers and resultant polarization fields also can increase a reliability of the corresponding device.

As used herein, unless otherwise noted, the term "set" means one or more (i.e., at least one) and the phrase "any solution" means any now known or later developed solution. Additionally, unless otherwise noted, the term "approximately" and similar terms means within +/−ten percent. As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by an active structure during operation of the corresponding device. For a given layer, the wavelength can be measured in a material of consideration and can depend on a refractive index of the material.

Figure 1A:
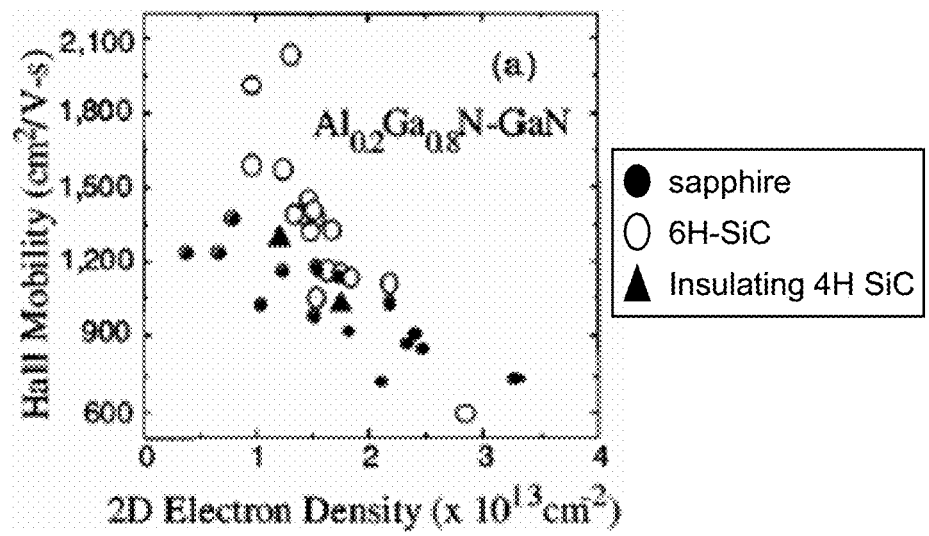
FIGS. 1A and 1B show electron mobility measurements for different substrates as a function of the sheet electron density according to the prior art.
Figure 1B:
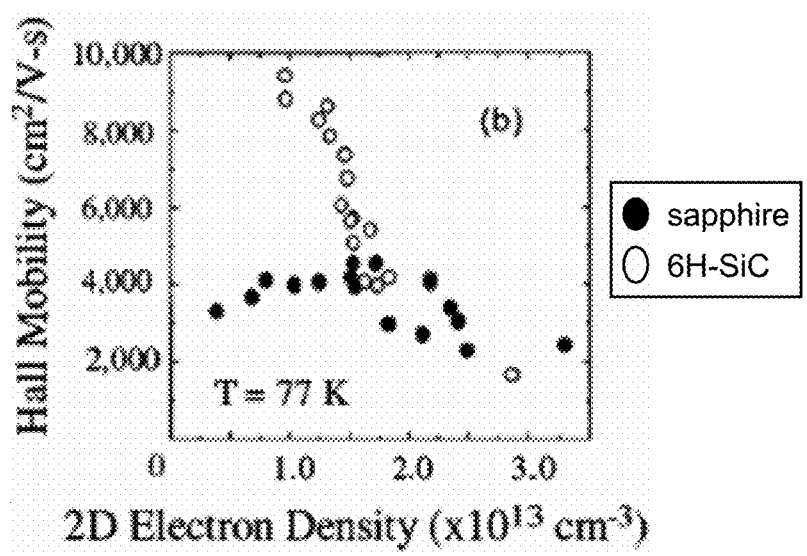
Figure 2:
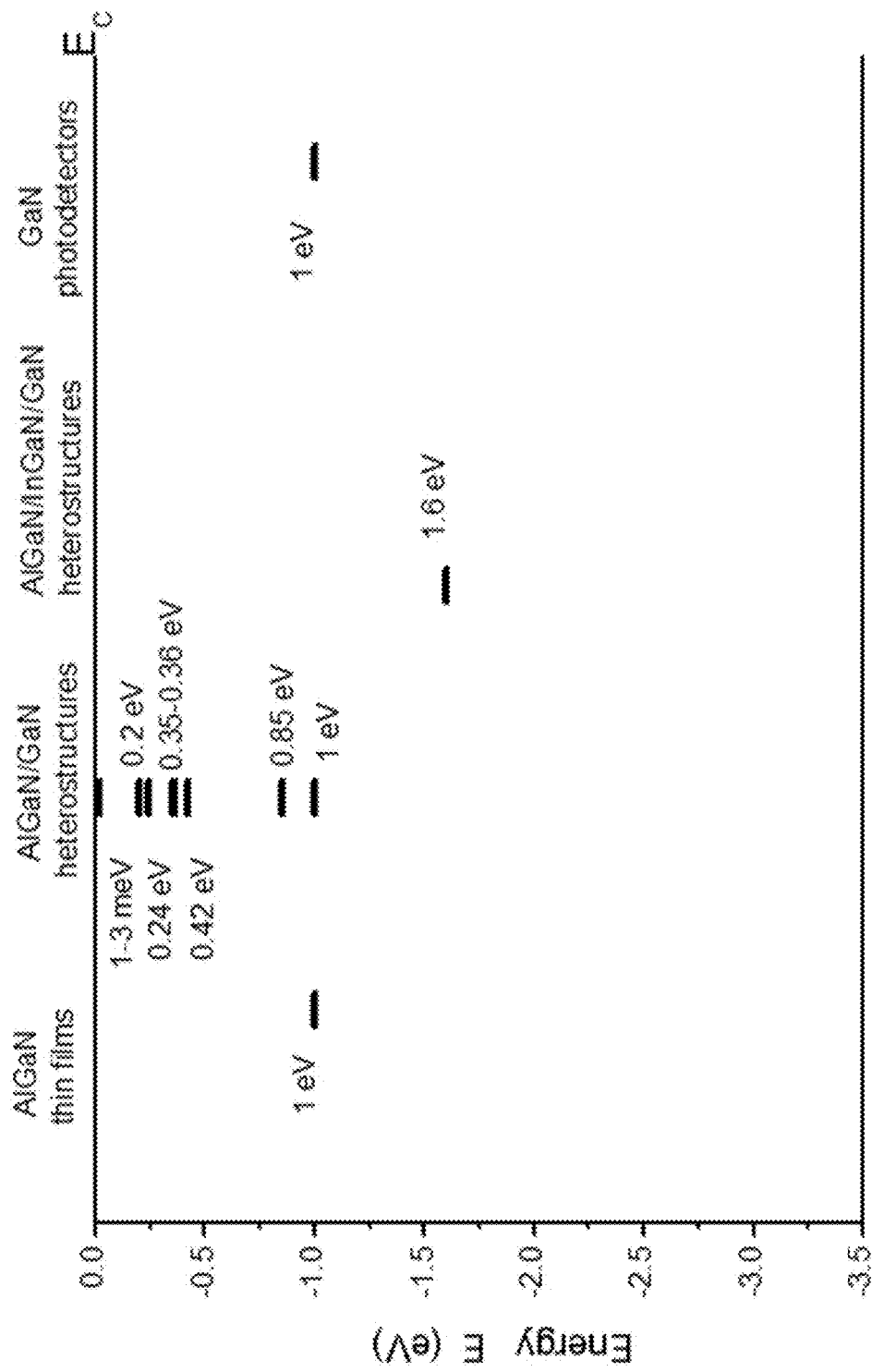
FIG. 2 shows various traps associated with various heterostructures according to the prior art.
Figure 3:
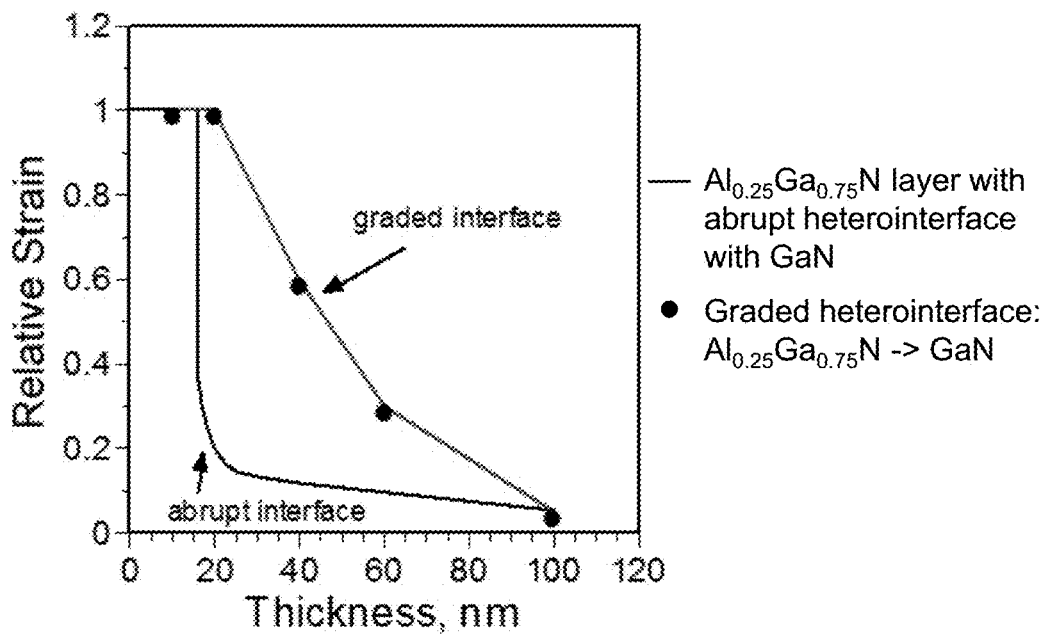
FIG. 3 shows relative strain in an $Al_{0.25}Ga_{0.75}N$ layer grown on a thick GaN substrate according to the prior art.
Figure 4:
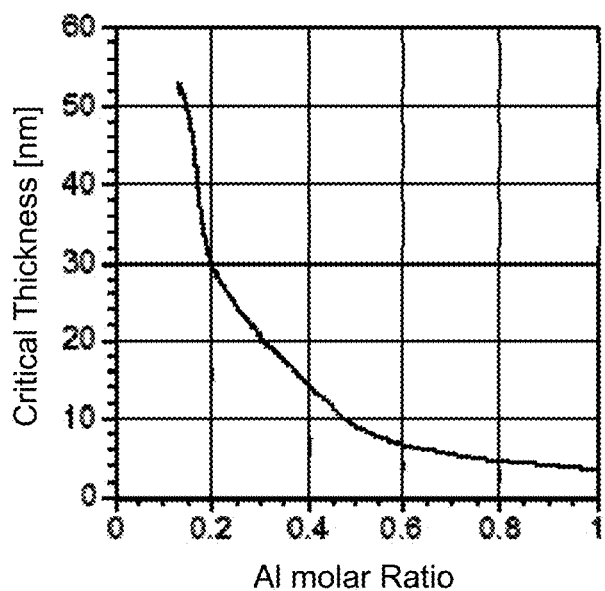
FIG. 4 shows the dependence of the critical thickness on the aluminum molar ratio of an AlGaN layer in an AlGaN/GaN heterostructure according to the prior art.
Figure 5:
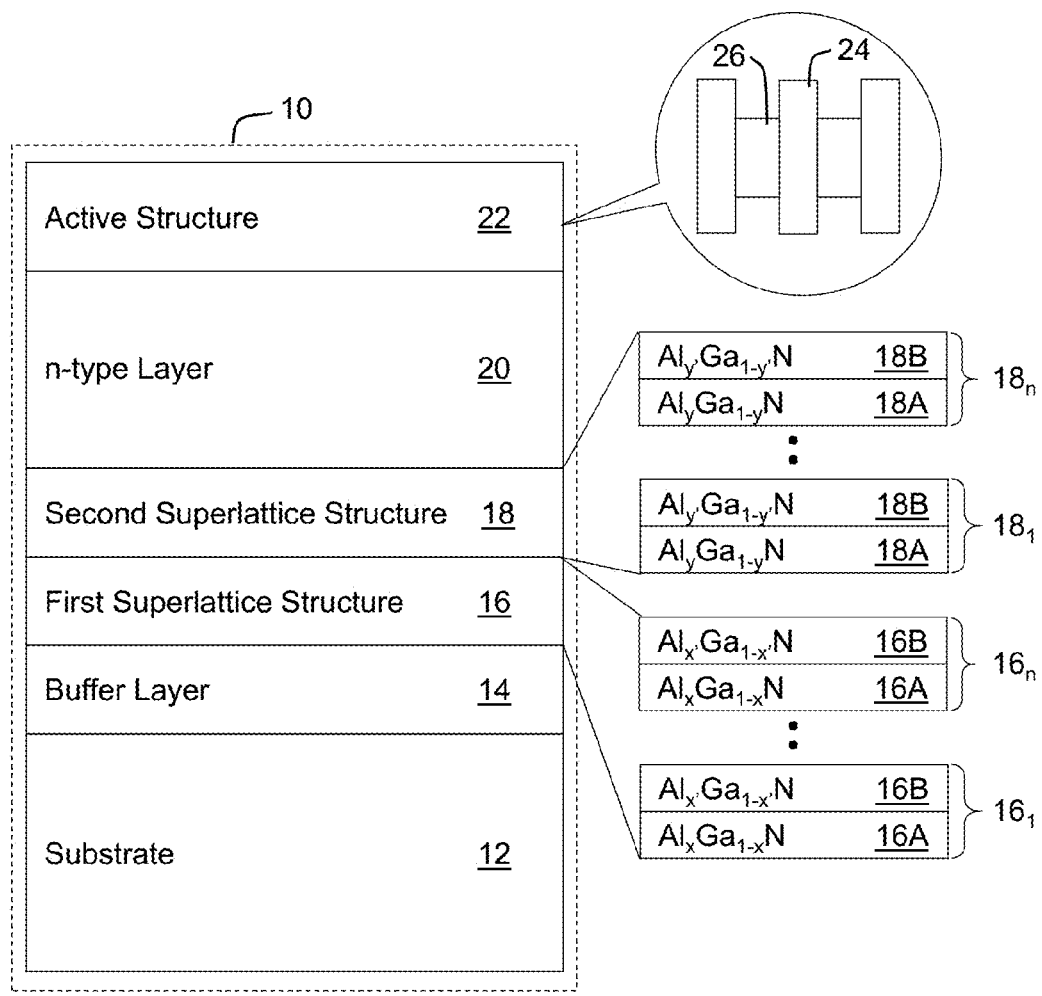
FIG. 5 shows an illustrative heterostructure according to an embodiment.

Turning to the drawings, FIG. 5 shows an illustrative heterostructure 10 according to an embodiment. The heterostructure 10 can be configured for light emission and/or light sensing. To this extent, the heterostructure 10 can be used in fabricating an optoelectronic device, such as a conventional or super luminescent light emitting diode (LED), a light emitting laser, a laser diode, a light sensor, an ultraviolet sensor, a photodetector, a photodiode, an avalanche diode, and/or the like. In an illustrative embodiment, the optoelectronic device is configured to operate as an emitting device, such as a light emitting diode (LED). In this case, during operation of the optoelectronic device, application of a bias comparable to the band gap results in the emission of electromagnetic radiation from an active structure 22 of the heterostructure 10. The electromagnetic radiation emitted by the heterostructure 10 can have a peak wavelength within any range of wavelengths, including visible light, ultraviolet radiation, deep ultraviolet radiation, infrared light, and/or the like. In an embodiment, the heterostructure 10 is configured to emit radiation having a dominant wavelength within the ultraviolet range of wavelengths. In a more specific embodiment, the dominant wavelength is within a range of wavelengths between approximately 210 and approximately 350 nanometers.

The heterostructure 10 includes a substrate 12, a buffer layer 14 adjacent to the substrate 12, a first superlattice structure 16 adjacent to the buffer layer 14, a second superlattice structure 18 adjacent to the first superlattice structure 16, an n-type layer 20 (e.g., a cladding layer, electron supply layer, contact layer, and/or the like) adjacent to the second superlattice structure 18, and an active structure 22 adjacent to the n-type layer 20. In an embodiment, each subsequent structure/layer is epitaxially grown on a previous structure/layer using any solution. The substrate 12 can be sapphire, silicon carbide (SiC), silicon (Si), GaN, AlGaN, AlON, LiGaO$_2$, or another suitable material, and the buffer layer 14 can be composed of AlN, an AlGaN/AlN superlattice, and/or the like.

In an illustrative embodiment, the heterostructure 10 is a group III-V materials based heterostructure, in which some or all of the various layers/structures are formed of elements selected from the group III-V materials system. In a still more particular illustrative embodiment, the various layers of the heterostructure 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. The molar fractions given by W, X, Y, and Z can vary between the various layers of the heterostructure 10. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements. Illustrative aspects of the invention are further described in conjunction with ternary AlGaN layers. However, it is understood that these layers are only illustrative of the nitride materials that can be utilized. For example, in other embodiments, one or more of the semiconductor layers can include indium, thereby forming a quaternary AlInGaN layer. To this extent, quantum wells in an active structure described herein can contain indium, e.g., at least one percent indium in a more particular embodiment.

The heterostructure 10 can be configured for emission or sensing electromagnetic radiation of a target wavelength. To this extent, the active structure 22 can be formed of materials suitable for generating and/or sensing electromagnetic radiation of the target wavelength. Based on the materials utilized in the active structure 22, the remainder of the heterostructure 10 can be configured (e.g., optimized) to, for example, control stresses within the active structure 22, polarization fields, conductivity of the layers, mitigation of defects, and/or the like, which in turn can lead to improved reliability and/or quantum efficiency for the heterostructure 10 and corresponding device.

Configuration of the remainder of the heterostructure 10 can include selection and/or adjustment of one or more of various attributes of the layers/structures in the heterostructure 10, inclusion or removal of one or more layers/structures in the heterostructure 10, a change in order of the layers/structures in the heterostructure 10, and/or the like. Illustrative layer/structure attributes include, for example, adjustment of: an aluminum molar fraction in a material of the layer/structure; a thickness of a layer/structure; one or more growth conditions of the layer/structure (e.g., temperature, pressure, V/III ratio, etc.); a doping concentration of the layer/structure; and/or the like.

For a group III nitride heterostructure 10, the buffer layer 14 can be epitaxially grown over the substrate 12. For example, the buffer layer 14 can be formed of aluminum nitride (AlN). Alternatively, the buffer layer 14 can be formed of AlGaN having an aluminum molar fraction between 0.3 and 1. The buffer layer 14 can be grown to a thickness configured to provide a sufficient amount of stress relief and/or dislocation reduction. In an illustrative embodiment, the buffer layer 14 can have a thickness greater than 0.1 microns. Additionally, the thickness of the buffer layer 14 can be less than or equal to one hundred microns to minimize the development of cracks within the buffer layer 14. For example, the buffer layer 14 can have a thickness between 5 Angstroms and 100 microns.

The first superlattice structure 16 can be grown (e.g., deposited) over the buffer layer 14. The first superlattice structure 16 can include multiple periods $16_1 \ldots 16_n$, each of which includes two layers 16A, 16B. In an illustrative embodiment, for each period $16_1 \ldots 16_n$, the layer 16A is formed of $Al_xGa_{1-x}N$ and the layer 16B is formed of $Al_{x'}Ga_{1-x'}N$. The layer 16B can have an aluminum molar fraction x' in a range 0.1<x'<0.8. The layer 16A can have a higher aluminum molar fraction than that of the layer 16B (e.g., x>x'). However, it is understood that this is only illustrative and other embodiments are possible. For example, the first superlattice structure 16 could include periods formed of any number of two or more layers 16A, 16B. Additionally, the layer 16A of the periods $16_1 \ldots 16_n$ can be formed of AlN. However, when the layer 16A includes gallium, a difference between x and x' can be less than 0.5. A thickness of each layer 16A, 16B can be between 1 nanometer and 100 nanometers, and the first superlattice structure 16 can include between ten and one hundred periods. In an illustrative embodiment, the first superlattice structure 16 includes layers 16A, 16B having thicknesses of approximately thirty nanometers (within a range of 15-50 nanometers) and a total of approximately forty periods. In another embodiment, the layers 16A can have thicknesses in the range of 1-50 nanometers, and the layers 16B can have thicknesses in the range of 5-100 nanometers.

The second superlattice structure 18 can be grown (e.g., deposited) over the first superlattice structure 16. The second superlattice structure 18 can include multiple periods $18_1 \ldots 18_m$, each of which includes two layers 18A, 18B. In an illustrative embodiment, for each period $18_1 \ldots 18_m$, the layer 18A is formed of $Al_yGa_{1-y}N$ and the layer 18B is formed of $Al_{y'}Ga_{1-y'}N$. The layer 18B can have an aluminum molar fraction y' in a range 0.1<y'<0.65. The layer 18A can have a higher aluminum molar fraction than that of the layer 18B (e.g., y>y'). However, it is understood that this is only illustrative and other embodiments are possible. For example, the second superlattice structure 18 could include periods formed of any number of two or more layers 18A, 18B. Additionally, the layer 18A of the periods $18_1 \ldots 18_m$ can be formed of AlN. However, when the layer 18A includes gallium, a difference between y and y' can be less than 0.5. A molar fraction y' for the layer 18B can be configured based on the molar fraction x' for the layer 16B in the first superlattice structure 16. For example, y' can be less than x'. In an embodiment, y' is at least 0.05 lower than x'. A thickness of each layer 18A, 18B can be between 1 nanometer and 100 nanometers, and the second superlattice structure 18 can include between ten and one hundred periods. In an illustrative embodiment, the second superlattice structure 18 includes layers 18A, 18B having thicknesses of approximately thirty nanometers (within a range of 15-50 nanometers) and a total of approximately forty periods. In another embodiment, the layers 16A can have thicknesses in the range of 1-50 nanometers, and the layers 16B can have thicknesses in the range of 5-100 nanometers.

The n-type layer 20 can be grown (e.g., deposited) over the second superlattice structure 18. The n-type layer 20 can be formed of $Al_zGa_{1-z}N$, where 0.1<z<0.7 and have a thickness between 0.1 microns and fifty microns. The molar fraction z of the n-type layer 20 can be selected based on the molar fraction y' for the layer 18B in the second superlattice structure 18. For example, the molar fraction z can be selected to be less than the molar fraction y'. Additionally, the n-type layer 20 can comprise an n-type doping (e.g., using silicon atoms) with a doping concentration on the order of $10^{18}$ dopants per $cm^3$.

The active structure 22 can be grown (e.g., deposited) over the n-type layer 20. The active structure can be undoped or comprise an n-type doping (e.g., using silicon atoms) with a doping concentration on the order of $10^{18}$ dopants per $cm^3$. As illustrated by a band gap diagram shown in the inset of FIG. 5, the active structure 22 can include a multiple quantum well structure formed of barriers 24 comprising $Al_bGa_{1-b}N$ and quantum wells 26 formed of $Al_qGa_{1-q}N$, where b−q>0.05. The barriers 24 in the active structure 22 can have thicknesses in a range of 5 nanometers to 25 nanometers (e.g., about ten nanometers), while the quantum wells 26 can have thicknesses in a range of 1 nanometer to 5 nanometers (e.g., about two nanometers). However, it is understood that the actual thicknesses of the barriers 24 and quantum wells 26 can vary between fifty and one hundred percent around these thicknesses.

The barriers 24 in the active structure 22 have a higher aluminum molar fraction b than the aluminum molar fraction q of the quantum wells 26. The quantum well aluminum molar fraction q, the thicknesses of the quantum wells 26, as well as the thicknesses and aluminum molar concentrations b of the barriers 24 can be chosen such that the active structure 22 emits electromagnetic radiation having a target wavelength, while maximizing radiative recombination and the injection efficiency of the heterostructure 10 using any solution.

The aluminum molar fractions x, x', y, y', z, b, and q can be configured based on a target wavelength for the active structure 22. In an embodiment, the heterostructure 10 is configured for inclusion in an optoelectronic device having a target wavelength in the ultraviolet range of wavelengths. In this case, the active structure 22 can be configured, e.g., by adjusting the aluminum molar fractions b, q to emit or sense electromagnetic radiation of the target wavelength using any solution. In general, for smaller target wavelengths, the aluminum molar fractions b, q, increase.

Based on the aluminum molar fractions b, q, the aluminum molar fractions x, x', y, y', and z can be configured to control the stresses within the active layer 22, as well as the polarization fields, and/or the like. For example, the active structure 22 can be configured to emit electromagnetic radiation having a peak wavelength between 260 nanometers and 300 nanometers. In this case, the aluminum molar fraction b can be in a range of 0.4<b<0.7 while the aluminum molar fraction q can be in a range of 0.2<q<0.6. Furthermore, the aluminum molar fractions x', y', and z can be within the ranges: 0.4<z<0.75; 0.5<y'<0.8; and 0.6<x'<0.9, where z<y'<x'. As described herein, the aluminum molar fractions x, y can be one, in which case the corresponding layers are AlN, or can be higher than the corresponding x', y' molar fractions by less than 0.5. Furthermore, the buffer layer 14 can comprise an AlGaN layer having an aluminum molar fraction between 0.7 and 1.

Due to a high stress field within the active structure 22 of the heterostructure 10, it is desirable to keep the band gap of the quantum wells 26 significantly lower than that of the target wavelength. The band gap of the quantum wells 26 can be reduced by reducing the aluminum molar fraction q of the quantum wells 26. To this extent, an active structure 22 configured to emit electromagnetic radiation having a peak wavelength between 300 nanometers and 360 nanometers typically has lower b, q values than those utilized for the 260-300 nanometer range. For example, the aluminum molar fraction b can be in a range of 0.1<b<0.6 while the aluminum molar fraction q can be in a range of 0<q<0.35. In a more particular example for emission optimized around 310 nanometers, the aluminum molar fraction q of the quantum wells 26 in the active structure 22 can be in a range of 0.15≤q≤0.25 and the aluminum molar fraction b for the barriers 24 can be in a range of 0.31≤b≤0.5, where b−q>0.05 and b>q>0. To this extent, the composition of the n-type layer 20 can have a lower aluminum molar fraction z than that utilized for the 260-300 nanometer range of wavelengths. Similarly, the aluminum molar fractions x', y' also can be lower than those used for the 260-300 nanometer range of wavelengths. In general, for operation in the 300-360 nanometer range (more particularly in the 310-320 nanometer range), the aluminum molar fraction z can be about 5-50% (5-30% in a more particular embodiment) less than the aluminum molar fraction z used for a corresponding 260-300 nanometer structure and the aluminum molar fractions x' and y', can be about 10-40% (10-30% in a more particular embodiment) less than the aluminum molar fractions x', y' used for the corresponding 260-300 nanometer structure. To this extent, an illustrative embodiment of the aluminum molar fractions x', y', and z used for a 300-360 nanometer heterostructure 10 can correspond to the ranges: 0.25<z<0.5; 0.45<y'<0.65; and 0.6<x'<0.8, where z<y'<x'. Furthermore, the buffer layer 14 can comprise an AlGaN layer having an aluminum molar fraction between 0.3 and 0.8.

An active structure 22 configured to emit electromagnetic radiation having a peak wavelength between 230 nanometers and 260 nanometers typically has higher b, q values than those required for the 260-300 nanometer range. For example, the aluminum molar fraction q for the quantum wells 26 can be in a range of 0.45<q<0.75 and the aluminum molar fraction b for the barriers can be in a range of 0.55<b<0.9, where b−q>0.05 and b>q>0.2. To this extent, the composition of the n-type layer 20 can have a higher aluminum molar fraction z than that utilized for the 260-300 nanometer range of wavelengths. For example, the aluminum molar fraction z can be in a range of 0.6≤z<0.9, where z>q. In this case, the heterostructure 10 can be formed without one or both of the superlattice structures 16, 18 as stress relief between an AlN buffer layer 14 and the n-type layer 20 may not be required.

Similarly, the aluminum molar fractions x', y' also can be lower than those used for the 260-300 nanometer range of wavelengths. In general, for operation in the 300-360 nanometer range (more particularly in the 310-320 nanometer range), the aluminum molar fraction z can be about 5-50% (5-30% in a more particular embodiment) less than the aluminum molar fraction z used for a corresponding 260-300 nanometer structure and the aluminum molar fractions x' and y', can be about 10-40% (10-30% in a more particular embodiment) less than the aluminum molar fractions x', y' used for the corresponding 260-300 nanometer structure. To this extent, an illustrative embodiment of the aluminum molar fractions x', y', and z use for a 300-360 nanometer heterostructure 10 can correspond to the ranges: 0.25<z<0.5; 0.45<y'<0.65; and 0.6<x'<0.8, where z<y'<x'.

In an embodiment, it is desirable that the structures/layers 14, 16, 18, 20 be transparent to the electromagnetic radiation having a target wavelength for the active structure 22. In this case, a band gap of the buffer layer 14, an average band gap of each of the superlattice structures 16, 18, and a band gap of the n-type layer 20 can be similar to or higher than that of the conduction/valence energy level separation within the quantum wells 26 of the active structure 22. This configuration can result in transparency of the structures/layers 14, 16, 18, 20 located between the substrate 12 and the active structure 22 and avoid internal absorption of electromagnetic radiation having the target wavelength.

One or more additional attributes of the growth of the structures/layers 14, 16, 18, 20 and/or the resulting structures/layers 14, 16, 18, 20 can be configured based on stresses developed in the corresponding structure. For example, one or more of: the thickness, composition, and/or growth conditions of a semiconductor layer can be configured so that the stresses do not exceed the threshold stresses developed due to lattice mismatch, thermal stresses, and stresses resulting during formation of the semiconductor layer (e.g., including stresses due to coalescence of semiconductor grains or islands formed during the growth process). In an embodiment, stresses in an overall semiconductor film are evaluated by analyzing the bowing of the substrate 12. For example, the Stoney formula can be used to link the bowing and the stresses in the semiconductor layers, wherein the Stoney formula is given by:

$$\sigma = \frac{E_s h_s^2 k}{6 h_f (1 - v_s)},$$

where σ is the stress in the semiconductor composite film; $E_s$ is Young's modulus of the substrate 12; $h_s$ is the substrate 12 thickness; k is the substrate 12 curvature; $h_f$ is the semiconductor composite film thickness; and $v_s$ is the substrate 12 Poisson ratio. The Stoney formula involves assumptions that the thickness of the semiconductor composite film is significantly smaller than the thickness of the substrate 12 and that elastic isotropic conditions accurately describe the conditions in the substrate-film system.

It is understood that the heterostructure 10 is only illustrative. To this extent, a heterostructure can include one or more additional layers/structures. Similarly, it is understood that a heterostructure described herein can be implemented without one or more of the layers/structures, regardless of the target wavelength. For example, an embodiment of the heterostructure can include only one or neither of the superlattice structures 16, 18. To this extent, when the heterostructure does not include one or both superlattice structures 16, 18, a graded semiconductor layer can be included between the buffer layer 14 and the n-type layer 20, for which the composition slowly changes along the thickness from the layer, e.g., from a composition comparable to the buffer layer 14 to a composition comparable to the n-type layer 20. Furthermore, it is understood that one or more of the layers/sublayers described herein can include one or more additional attributes. For example, a layer/sublayer can be formed such that at least a portion of a surface of the layer/sublayer is textured (e.g., using etching, sputtering, molecular beam epitaxy, and/or the like). The texturing can be configured to promote adhesion, reduce stress, increase light extraction, and/or the like.

Figure 6:
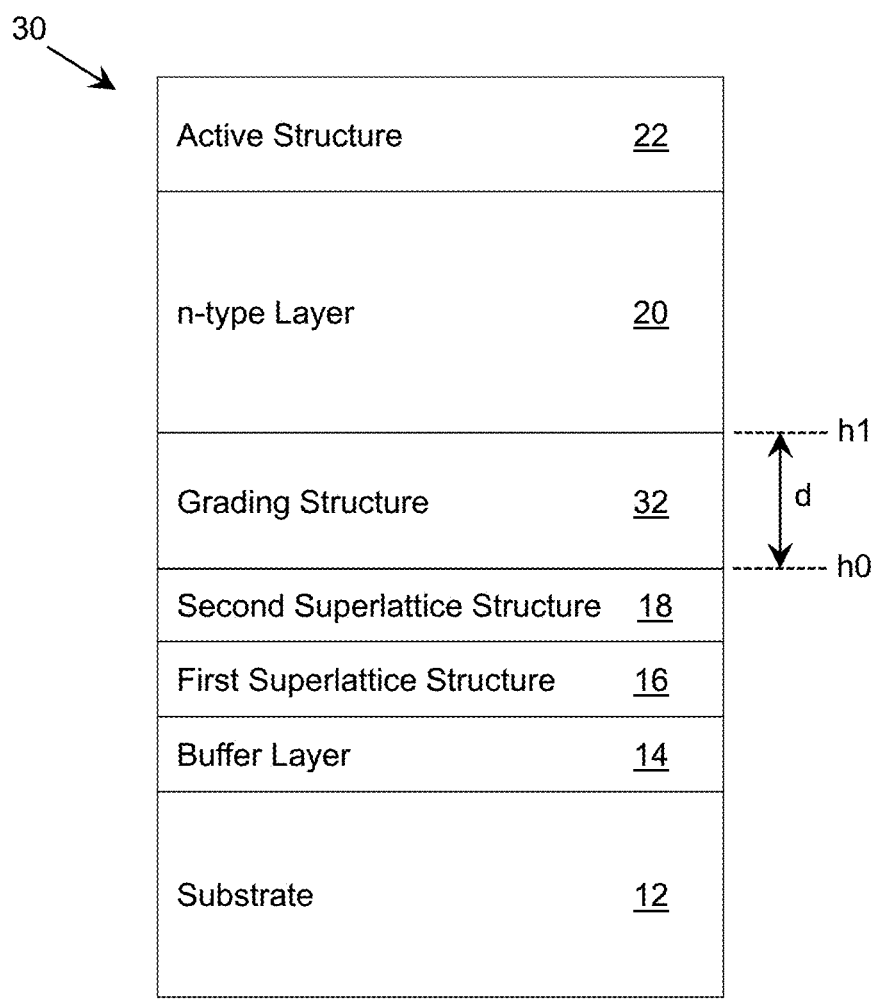
FIG. 6 shows an illustrative heterostructure according to another embodiment.

FIG. 6 shows an illustrative heterostructure 30 according to another embodiment. In this case, the heterostructure 30 includes a grading structure 32 located between the second superlattice structure 18 and the n-type layer 20. The grading structure 32 can be formed of $Al_{g(h)}Ga_{1-g(h)}N$, where the aluminum molar fraction g is a function of a height coordinate h within the grading structure 32. In an embodiment, the aluminum molar fraction g has a grading such that $g(h=h0)=y'$ and $g(h=h1)=z$, where h0 is the height coordinate corresponding to the heterointerface between the grading structure 32 and a top layer of the second superlattice structure 18 and h1 is the height coordinate corresponding to the heterointerface between the grading structure 32 and the n-type layer 20. In a more particular embodiment, the grading is a linear grading and can be calculated as $g(h)=y'+(h-h0)\cdot(z\cdot y')/(h1\cdot h0)$. A thickness d of the grading structure 32 can vary from 5 nanometers to 1000 nanometers depending on the target wavelength of the electromagnetic radiation and can be either doped or undoped. In a more particular embodiment, the thickness d can be in a range between 150 nanometers and 280 nanometers. When doped, the grading structure 32 can have an n-type doping concentration (e.g., using silicon atoms) on the order of $10^{18}$ dopants per $cm^3$.

It is understood that the heterostructure 30 is only illustrative. For example, in another embodiment, the grading structure 32 can be located on a different underlying layer, such as the buffer layer 14 (e.g., when neither superlattice structure 16, 18 is included in the heterostructure). To this extent, the grading structure 32 can have an aluminum molar fraction $g(h=h0)$ that is approximately equal to the aluminum molar fraction of the top surface of the underlying layer (e.g., the buffer layer 14) on which the grading structure 32 is formed (e.g., epitaxially grown). Additionally, it is understood that the linear grading described herein is only illustrative of various grading approaches. For example, in an embodiment, the grading can be adjusted in a series of steps as the grading structure 32 is grown. Furthermore, in another embodiment, the grading structure 32 can be an undoped (e.g., unintentionally doped) layer having an aluminum molar fraction that is less than or equal to the aluminum molar fraction of the underlying layer (e.g., y') and greater than or equal to the aluminum molar fraction z of the n-type layer 20.

FIG. 7 shows another illustrative heterostructure 40 according to an embodiment. In this case, the heterostructure 40 includes several tensile/compressive superlattices (TCSLs) 42A-42D located in the heterostructure 40 between the buffer layer 14 and the n-type layer 20. It is understood that while the heterostructure 40 is shown including four TCSLs 42A-42D, a heterostructure 40 can include any combination of any number of one or more TCSLs 42A-42D within the heterostructure 40. For example, a heterostructure 40 can include: only TCSL 42A; TCSLs 42A, 42C; and/or the like.

Each TCSL 42A-42D comprises alternating compressive or tensile layers, which can be configured to reduce the stress in the heterostructure 40, bend threading dislocations, and/or the like. Formation of such layers 42A-42D can be controlled by growth parameters such as the V/III ratio, temperature, pressure, and/or the like, which can result in changes to the lattice parameter for the material. Additional discussion regarding the formation and use of TCSLs 42A-42D is included in U.S. patent application Ser. No. 13/692,191, titled "Epitaxy Technique for Growing Semiconductor Compounds," which was filed on 3 Dec. 2012, and which is hereby incorporated by reference. As described therein, tensile and compressive layers can be obtained by changing the V/III ratio of the precursors during growth, such as metalorganic chemical vapor deposition (MOCVD) growth.

In an embodiment, a TCSL 42A-42D (e.g., TCSL 42D) includes alternating $Al_uGa_{1-u}N$ tensile layers, where $0.3<u<1$, and $Al_tGa_{1-t}N$ compressive layers, where $0.1<t<1$, which can be epitaxially grown using any solution. The tensile layers can have a lattice mismatch with the compressive layers of at least 0.1%. Each layer in the TCSL 42A-42D can have a thickness between 5 nanometers and 5000 nanometers. In a more particular embodiment, a TCSL 42A-42D, such as TCSL 42D, includes layers having thicknesses between 5 nanometers and 30 nanometers and $0.3<u$, $t<1$. When a heterostructure includes one or more TCSLs 42C, 42D located immediately adjacent to the grading structure 32, it is understood that the grading structure 32 can have a varying aluminum content that is selected based on the corresponding immediately adjacent sublayer of the corresponding TCSL 42C, 42D.

Figure 8:
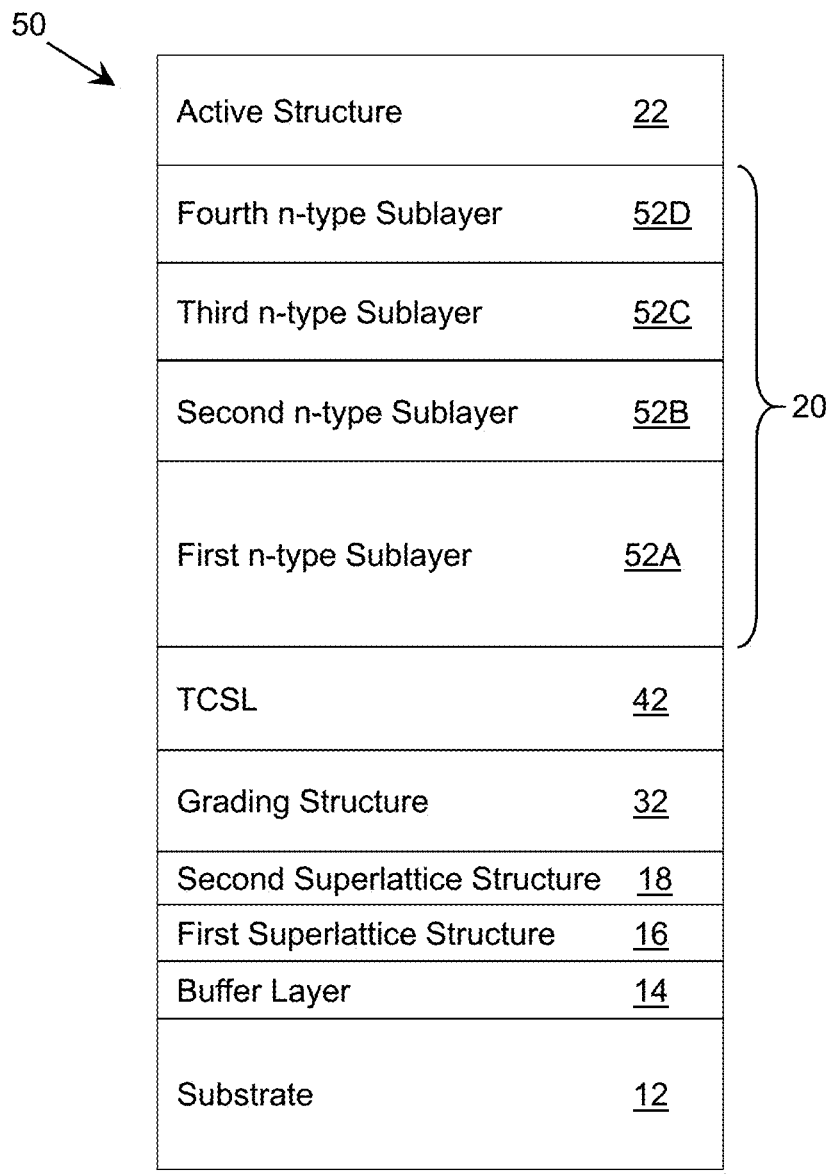
FIG. 8 shows yet another illustrative heterostructure according to an embodiment.

FIG. 8 shows yet another illustrative heterostructure 50 according to an embodiment. In this case, the heterostructure 50 includes a single TCSL 42 located between the grading structure 32 and a compound n-type layer 20. The compound n-type layer 20 is formed of four n-type sublayers 52A-52D. The sublayers 52A-52D can be configured to provide a varying aluminum molar fraction and/or doping concentration along the height of the n-type layer 20.

In an illustrative embodiment, such as when the target wavelength is between 260-300 nanometers, the first n-type sublayer 52A comprises an $Al_{z1}Ga_{1-z1}N$ layer having a thickness in a range of 0.1 to 3 microns, an aluminum molar fraction z1 in a range of $0.5\leq z1\leq 0.7$, and an n-type doping concentration on the order of $10^{18}$ dopants per $cm^3$ (e.g., in a range of $5\times 10^{17}$ to $5\times 10^{18}$ dopants per $cm^3$); the second n-type sublayer 52B comprises an $Al_{z2}Ga_{1-z2}N$ layer having a thickness in a range of 0.1 to 0.4 microns, an aluminum molar fraction z2 comparable to or the same as z1, and an n-type doping concentration at least ten percent higher than the doping concentration of the first n-type sublayer 52A; the third n-type sublayer 52C comprises an $Al_{z3}Ga_{1-z3}N$ layer having a thickness in a range of 0.1 to 0.4 microns, an aluminum molar fraction z3 comparable to or the same as z2, and an n-type doping concentration on the order of $10^{18}$ dopants per $cm^3$; and the fourth n-type sublayer 52D comprises an $Al_{z4}Ga_{1-z4}N$ layer having a thickness in a range of 0.05 to 0.4 microns, an aluminum molar fraction z4 approximately ten percent smaller than z3, and an n-type doping concentration at least ten percent smaller (twenty percent smaller in a more particular embodiment) than the doping concentration of the third n-type sublayer 52C.

It is understood that four sublayers 52A-52D is only illustrative, and the n-type layer 20 can be formed of any number of sublayers. For example, in another illustrative embodiment, such as when the target wavelength is between 300-360 nanometers, the n-type layer 20 can include five sublayers. In a more particular illustrative embodiment, the first n-type sublayer comprises an undoped $Al_{z1}Ga_{1-z1}N$ layer having a thickness in a range of 0.1 to 3 microns and an aluminum molar fraction z1 in a range of $0.1\leq z1\leq 0.6$; the second n-type sublayer comprises an $Al_{z2}Ga_{1-z2}N$ layer having a thickness in a range of 0.1 to 3 microns, an aluminum molar fraction z2 comparable to or the same as z1, and an n-type doping concentration on the order of $10^{18}$ dopants per $cm^3$ (e.g., in a range of $5\times 10^{17}$ to $5\times 10^{18}$ dopants per $cm^3$); the third n-type sublayer comprises an $Al_{z3}Ga_{1-z3}N$ layer having a thickness in a range of 0.1 to 0.4 microns, an aluminum molar fraction z3 comparable to or the same as z2, and an n-type doping concentration at least ten percent higher than the doping concentration of the second n-type sublayer; the fourth n-type sublayer comprises an $Al_{z4}Ga_{1-z4}N$ layer having a thickness in a range of 0.1 to 0.4 microns, an aluminum molar fraction z4 comparable to or the same as z3, and an n-type doping concentration comparable to the doping concentration of the third n-type sublayer; and the fifth n-type sublayer comprises an $Al_{z5}Ga_{1-z5}N$ layer having a thickness in a range of 0.1 to 0.3 microns, an aluminum molar fraction z5 approximately ten percent smaller than z4, and an n-type doping concentration at least ten percent smaller than the doping concentration of the fourth n-type sublayer.

Figure 9:
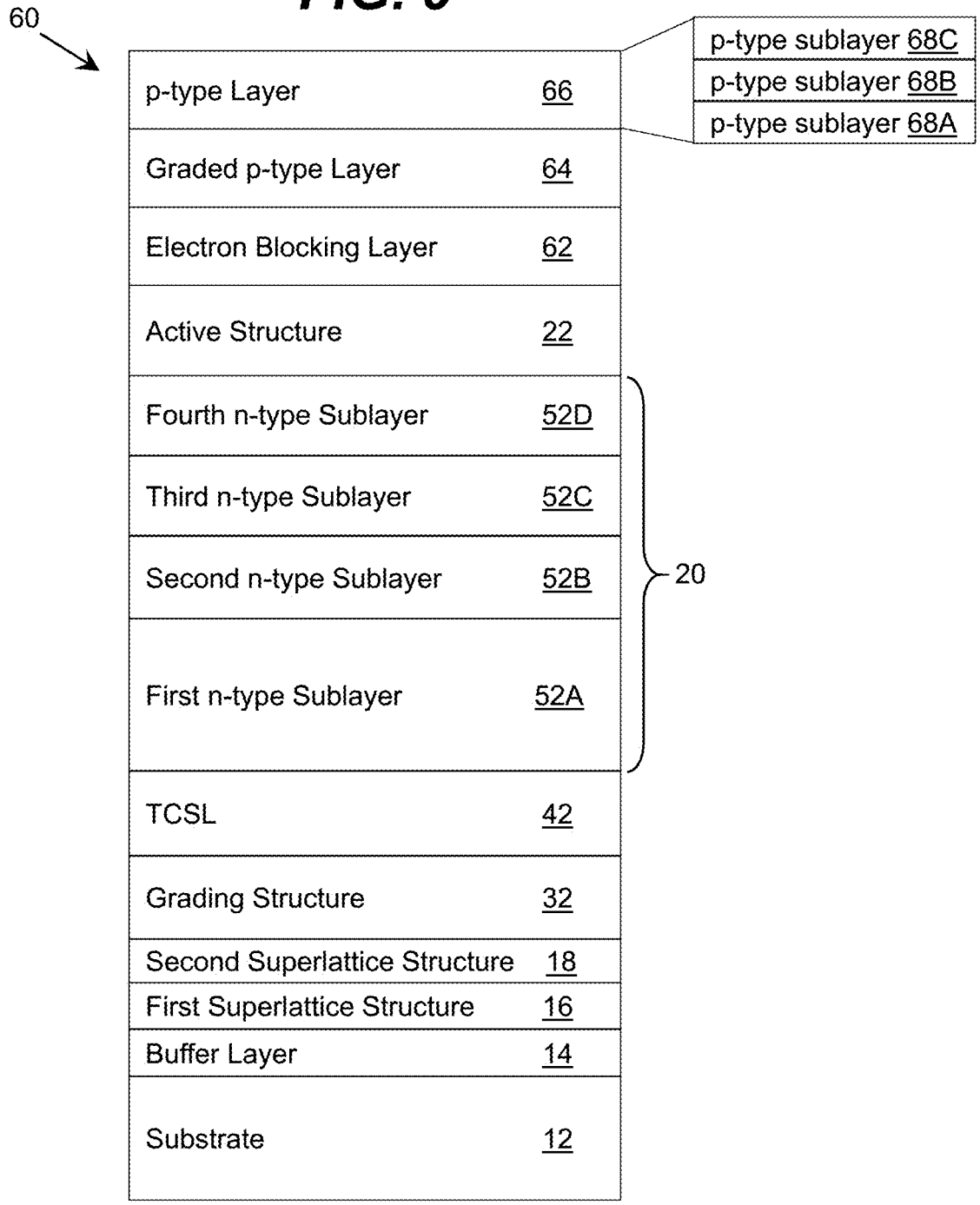
FIG. 9 shows an illustrative heterostructure including p-type layers according to an embodiment.

A heterostructure described herein can include one or more layers on a p-type side of the active structure 22, which are configured to improve one or more aspects of the reliability and/or operation of a device including the heterostructure. For example, FIG. 9 shows an illustrative heterostructure 60 including p-type layers 62, 64, 66 according to an embodiment. While the heterostructure 60 is shown including three p-type layers 62, 64, 66, it is understood that embodiments of a heterostructure can include any combination of one or more p-type layers 62, 64, 66.

The heterostructure 60 can include an electron blocking layer 62 located adjacent to the p-type side of the active structure 22 (e.g., epitaxially grown thereon). The electron blocking layer 62 can be configured to improve injection efficiency (e.g., a total recombination current relative to the total current in the heterostructure 60) of the heterostructure 60. In an embodiment, the aluminum molar fraction of the electron blocking layer 62 is at least five percent (ten percent in a more particular embodiment) larger than the barrier aluminum molar fraction b. To this extent, the aluminum molar fraction of the electron blocking layer 62 can be in a range between 0.2 and 1. In a more particular embodiment, the electron blocking layer 62 comprises a semiconductor layer having a high aluminum content, e.g., an aluminum molar fraction in a range of 0.5 to 0.9, which is designed to block electrons from injection into the p-type layer 64. The electron blocking layer 62 can have a thickness in the range of 5 nanometers to 100 nanometers (10 nanometers to 50 nanometers in a more specific embodiment) and a p-type doping concentration in the range of $10^{16}$ to $10^{18}$ dopants per $cm^3$.

In an alternative embodiment, the electron blocking layer 62 is formed of an $Al_{s1}Ga_{1-s1}N/Al_{s2}Ga_{1-s2}N$ superlattice, where 0.2<s1<0.8 and 9<s2<0.5. Each layer of the superlattice can have a thickness in the range of 0.5 nanometers to 5 nanometers, and a p-type doping concentration in the range of $10^{17}$ to $10^{19}$ dopants per $cm^3$.

The heterostructure 60 also can include a graded p-type layer 64, which can be epitaxially grown over the electron blocking layer 62. The graded p-type layer 64 can be formed of $Al_pGa_{1-p}N$, where 0≤p≤0.9, have a thickness in a range of 10 nanometers to 500 nanometers, and have a p-type doping concentration in a range of 0 to $10^{19}$ dopants per $cm^3$. The graded p-type layer 64 can have a graded aluminum molar fraction p. For example, the aluminum molar fraction p can vary from the aluminum molar fraction of the electron blocking layer 62 at the heterointerface between the electron blocking layer 62 and the graded p-type layer 64 to an aluminum molar fraction of the p-type layer 66 (e.g., zero) at the heterointerface between the graded p-type layer 64 and the p-type layer 66. In a more particular embodiment, the aluminum molar fraction p has a linear grading along a height of the graded p-type layer 64.

Similarly, the graded p-type layer 64 can have a graded doping concentration. For example, the doping concentration can vary from twice the doping concentration of the electron blocking layer 62 at the heterointerface between the electron blocking layer 62 and the graded p-type layer 64 to zero at the heterointerface between the graded p-type layer 64 and the p-type layer 66. In a more particular embodiment, the doping concentration has a linear grading along a height of the graded p-type layer 64. Alternatively, the doping concentration and/or aluminum molar fraction p can be adjusted in a series of steps as the graded p-type layer 64 is grown. In another embodiment, the aluminum molar fraction p is graded in a first portion of the graded p-type layer 64 while the doping concentration remains substantially constant, and the doping concentration is graded in a second portion of the graded p-type layer 64 while the aluminum molar fraction p remains substantially constant.

It is understood that the graded p-type layer 64 is only illustrative. For example, in another embodiment, the graded p-type layer 64 can have a constant composition and/or a constant doping concentration. For example, such a layer can be formed of AlGaN material having an aluminum molar fraction up to 0.6 (0.4 in a more particular embodiment), a thickness in a range of 1 nanometer to 500 nanometers, and a doping concentration in a range of $1 \times 10^{17}$ dopants per $cm^3$ and $1 \times 10^{19}$ dopants per $cm^3$.

The p-type layer 66 (e.g., a cladding layer, hole supply layer, contact layer, and/or the like) can be formed of GaN (having an aluminum molar fraction of zero) and can have a doping concentration in a range of $1 \times 10^{18}$ dopants per $cm^3$ and $1 \times 10^{20}$ dopants per $cm^3$. As illustrated, an embodiment of the p-type layer 66 can be formed of a series of sublayers 68A-68C. While three sublayers 68A-68C are shown, it is understood that any number of two or more sublayers 68A-68C can be utilized. Regardless, in an illustrative embodiment, the sublayers 68A-68C comprise: a first sublayer 68A formed of GaN, having a thickness of about 60 nanometers, and having a doping concentration of about $10^{18}$ dopants per $cm^3$; a second sublayer 68B formed of GaN, having a thickness of about 90 nanometers, and having a doping concentration between 1.1 to 2 times larger than the doping concentration of the first sublayer 68A; and a third sublayer 68C formed of GaN, having a thickness of about 10 nanometers, and having a doping concentration between 1.5 to 2.5 times larger than the doping concentration of the second sublayer 68B. However, it is understood that the thicknesses and doping concentrations of this embodiment can vary by +/−fifty percent of the stated values.

It is understood that while heterostructure 60 is shown including an n-type side of the active structure 22 configured similar to the heterostructure 50 (FIG. 8), embodiments can include one or more of the p-type layers 62, 64, 66 located on the p-type side of the active structure 22 in conjunction with any of the n-type side configurations described herein, including the heterostructures 40 (FIG. 7), 30 (FIG. 6), 10 (FIG. 5). In each case, one or more of the p-type layers 62, 64, 66 described herein can be epitaxially grown over the corresponding active structure 22 of the heterostructure.

Figure 10:
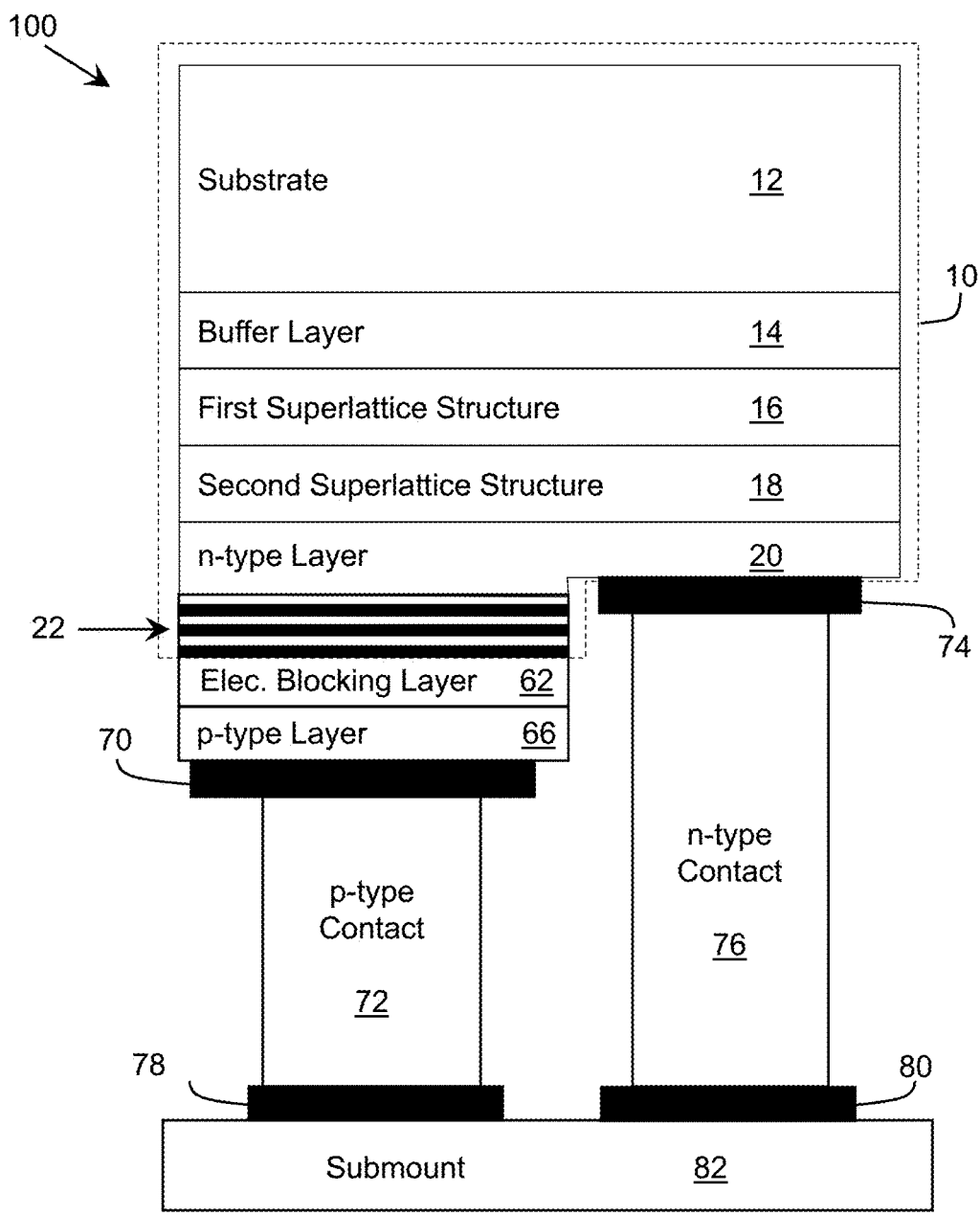
FIG. 10 shows a schematic structure of an illustrative flip chip light emitting diode according to an embodiment.

As described herein, the various heterostructures can be utilized to fabricate any of various types of optoelectronic devices. In an illustrative embodiment, a heterostructure described herein is utilized in fabricating a light emitting diode. In a more particular illustrative embodiment, the light emitting diode has a flip chip arrangement. To this extent, FIG. 10 shows a schematic structure of an illustrative flip chip light emitting diode 100 according to an embodiment. In this case, the diode 100 includes the heterostructure 10 (FIG. 5) on which an electron blocking layer 62 and a p-type layer 66 (e.g., a cladding layer) are formed. However, it is understood that this structure is only illustrative of the various heterostructures described herein.

As shown in conjunction with the device 100, a p-type metal 70 can be attached to the p-type layer 66 and a p-type contact (electrode) 72 can be attached to the p-type metal 70. Similarly, an n-type metal 74 can be attached to the n-type layer 20 and an n-type contact (electrode) 76 can be attached to the n-type metal 74. A surface of the n-type layer 20 can be accessed using any solution, such as etching. The p-type metal 70 and the n-type metal 74 can form ohmic contacts to the corresponding layers 66, 20, respectively. In an embodiment, the p-type metal 70 and the n-type metal 74 each comprise several conductive and reflective metal layers, while the n-type contact 76 and the p-type contact 72 each comprise highly conductive metal. In a further embodiment, the p-type layer 66 and/or the p-type contact 70 can be transparent to the electromagnetic radiation generated by the active structure 22. For example, the p-type layer 66 and/or the p-type contact 72 can comprise a short period superlattice lattice structure, such as an at least partially transparent magnesium (Mg)-doped AlGaN/AlGaN short period superlattice structure (SPSL). Furthermore, the p-type contact 72 and/or the n-type contact 76 can be reflective of the electromagnetic radiation generated by the active structure 22. In another embodiment, the n-type layer 20 and/or the n-type contact 76 can be formed of a short period superlattice, such as an AlGaN SPSL, which is transparent to the electromagnetic radiation generated by the active structure 22.

As further shown with respect to the optoelectronic device 100, the device 100 can be mounted to a submount 82 via the contacts 72, 76 in a flip chip configuration. In this case, the substrate 12 is located on the top of the optoelectronic device 100. To this extent, the p-type contact 72 and the n-type contact 76 can both be attached to a submount 82 via contact pads 78, 80, respectively. The submount 82 can be formed of aluminum nitride (AlN), silicon carbide (SiC), and/or the like.

It is understood that the layer configuration of the optoelectronic device 100 described herein is only illustrative. To this extent, a heterostructure for an optoelectronic device can include an alternative layer configuration (such as an alternative heterostructure described herein), one or more additional layers, and/or the like. As a result, while the various layers are shown immediately adjacent to one another (e.g., contacting one another), it is understood that one or more intermediate layers can be present in a heterostructure for an optoelectronic device. For example, a heterostructure for an optoelectronic device can include a Distributive Bragg Reflector (DBR) structure, which can be configured to reflect light of particular wavelength(s), such as those emitted by the active structure 22, thereby enhancing the output power of the device/heterostructure. Such a DBR structure can be located, for example, between the p-type layer 66 and the active structure 22.

Figure 11:
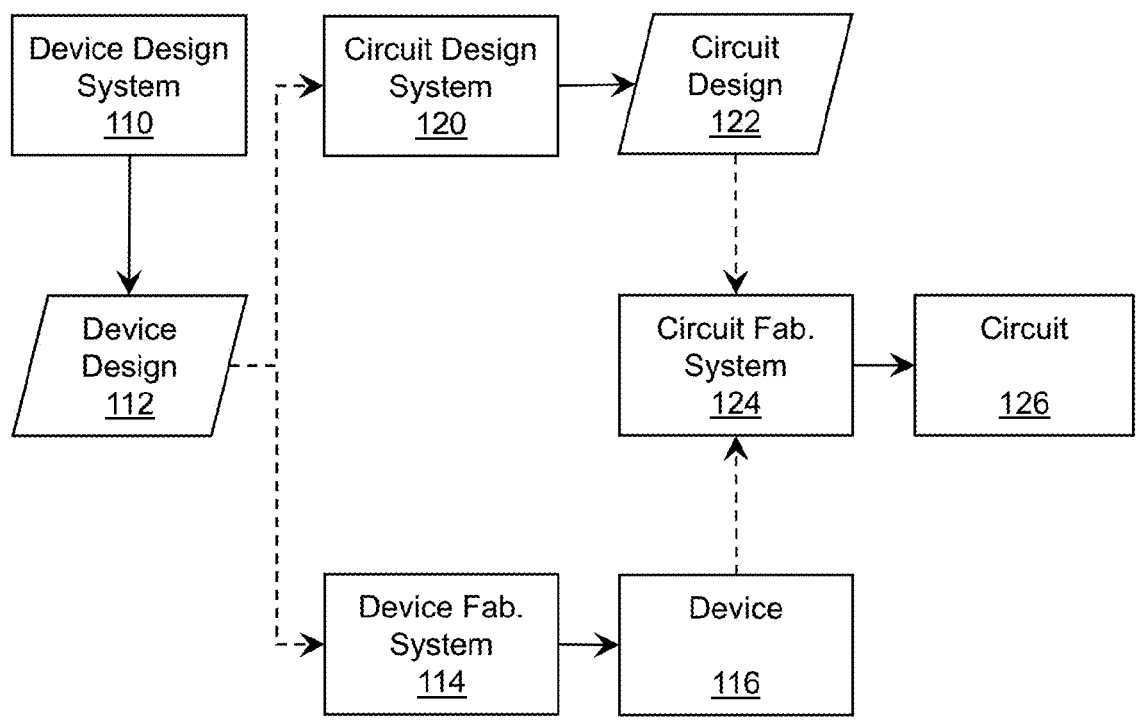
FIG. 11 shows an illustrative flow diagram for fabricating a circuit according to an embodiment.

In one embodiment, the invention provides a method of designing and/or fabricating a circuit that includes one or more devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure comprising:
   a substrate;
   a buffer layer located on the substrate, wherein the buffer layer is formed of a group III nitride material including aluminum;
   a grading structure located on the buffer layer;
   an n-type layer located on the grading structure, wherein the n-type layer is formed of a group III nitride material including aluminum having a molar fraction z, and wherein $0.1<z<0.85$;
   an active structure including quantum wells and barriers, wherein the quantum wells are formed of a group III nitride material including aluminum having a molar fraction q and the barriers are formed of a group III nitride material including aluminum having a molar fraction b, and wherein $b-q>0.05$, wherein the grading structure is formed of a group III nitride material having an aluminum molar fraction that decreases along a height of the grading structure in a direction from the buffer layer to the active structure;
   an electron blocking layer located on the active structure, wherein the electron blocking layer is formed of a group III nitride material including aluminum having a molar fraction B, and wherein B is at least $1.05*b$;
   a p-type GaN layer located on the electron blocking layer; and
   a graded p-type layer located between the electron blocking layer and the GaN layer, wherein the graded p-type layer has an aluminum molar fraction that decreases from B at a heterointerface between the electron blocking layer and the graded p-type layer to zero at a heterointerface between the graded p-type layer and the GaN layer.

2. The heterostructure of claim 1, wherein the active structure is configured to emit electromagnetic radiation having a peak emission wavelength between 230 nanometers and 260 nanometers, and wherein $0.65<z<0.85$ and $0.45<q<0.75$.

3. The heterostructure of claim 1, further comprising:
   a first superlattice structure located between the buffer layer and the grading structure, wherein the first superlattice structure is formed of a plurality of periods, each period including two layers formed of group III nitride materials including aluminum and having molar fractions x and x', where $x>x'$; and
   a second superlattice structure located between the first superlattice structure and the graded structure, wherein the second superlattice structure is formed of a plurality of periods, each period including two layers formed of group III nitride materials including aluminum and having molar fractions y and y', where $y>y'$.

4. The heterostructure of claim 1, wherein the active structure is configured to emit electromagnetic radiation having a peak emission wavelength between 300 nanometers and 360 nanometers, and wherein $0.1<x'<0.8$, $0.1<y'<0.65$, $0.1<z<0.6$, and $0<q<0.35$.

5. The heterostructure of claim 1, wherein the active structure is configured to emit electromagnetic radiation having a peak emission wavelength between 260 nanometers and 300 nanometers, and wherein $0.6<x'<0.9$, $0.5<y'<0.8$, $0.4<z<0.75$, and $0.2<q<0.6$.

6. A method of fabricating a device, the method comprising:
   creating a device design for the device, wherein the creating includes configuring an n-type side of a heterostructure for the device based on an active structure in the heterostructure including quantum wells and barriers configured to emit a target wavelength for the device, wherein the quantum wells are formed of a group III nitride material including aluminum having a molar fraction q and the barriers are formed of a group III nitride material including aluminum having a molar fraction b, and wherein $b-q>0.05$, wherein the configuring the n-type side includes:
      configuring a grading structure located between the active structure and a buffer layer of the heterostructure, wherein the grading structure is formed of a group III nitride material having an aluminum molar fraction that decreases along a height of the grading structure in a direction from the buffer layer to the active structure; and
      configuring an n-type layer located between the grading structure and the active structure, wherein the n-type layer is formed of a group III nitride material including aluminum having a molar fraction z selected based on at least one of: b or q; and
   fabricating the device according to the device design.

7. The method of claim 6, wherein the configuring the n-type side further includes:
   configuring a first superlattice structure located between the buffer layer and the grading structure, wherein the first superlattice structure is formed of a plurality of periods, each period including two layers formed of group III nitride materials including aluminum and having molar fractions x and x', where $x>x'$; and
   configuring a second superlattice structure located between the first superlattice structure and the graded structure, wherein the second superlattice structure is formed of a plurality of periods, each period including two layers formed of group III nitride materials including aluminum and having molar fractions y and y', where $y>y'$, and wherein y' and x' are selected such that $z<y'<x'$.

8. The method of claim 6, wherein the creating further includes configuring a p-type side of the heterostructure for the device based on the active structure.

9. The method of claim 8, wherein the configuring the p-type side includes:
   configuring an $Al_BGa_{1-B}N$ electron blocking layer located on the active structure, wherein B is at least $1.05*b$; and
   configuring a p-type GaN layer located on the electron blocking layer.

10. The method of claim 9, wherein the configuring the p-type side further includes configuring a graded p-type layer located between the electron blocking layer and the p-type GaN layer, wherein the graded p-type layer has an aluminum molar fraction that decreases from B at a heterointerface between the electron blocking layer and the graded p-type layer to zero at a heterointerface between the graded p-type layer and the p-type GaN layer.

11. The method of claim 9, wherein the p-type GaN layer includes three sublayers, and wherein each sublayer has a doping concentration that differs from an immediately adjacent sublayer by at least ten percent.

12. The method of claim 7, wherein the active structure is configured to emit electromagnetic radiation having a peak emission wavelength between 300 nanometers and 360 nanometers, and wherein $0.1<x'<0.8$, $0.1<y'<0.65$, $0.1<z<0.6$, and $0<q<0.35$.

13. The method of claim 7, wherein the active structure is configured to emit electromagnetic radiation having a peak emission wavelength between 260 nanometers and 300 nanometers, and wherein $0.6<x'<0.9$, $0.5<y'<0.8$, $0.4<z<0.75$, and $0.2<q<0.6$.

14. The method of claim 7, wherein the active structure is configured to emit electromagnetic radiation having a peak emission wavelength between 230 nanometers and 260 nanometers, and wherein $0.65<z<0.85$ and $0.45<q<0.75$.

15. The method of claim 7, wherein at least one of x or y equals one.

16. The method of claim 7, wherein the configuring the n-type side further includes configuring a tensile/compressive superlattice located between the second superlattice structure and the n-type layer.

17. The method of claim 6, wherein the active structure is configured to emit electromagnetic radiation having a peak emission wavelength between 300 nanometers and 360 nanometers, wherein the n-type layer includes four sublayers, and wherein each sublayer differs from an immediately adjacent sublayer by at least one of: doping concentration or aluminum molar fraction.

18. The method of claim 6, wherein the active structure is configured to emit electromagnetic radiation having a peak emission wavelength between 260 nanometers and 300 nanometers, wherein the n-type layer includes five sublayers, and wherein each sublayer differs from an immediately adjacent sublayer by at least one of: doping concentration or aluminum molar fraction.

* * * * *